United States Patent [19]
Butler et al.

[11] Patent Number: 5,751,556
[45] Date of Patent: May 12, 1998

[54] METHOD AND APPARATUS FOR REDUCING WARPAGE OF AN ASSEMBLY SUBSTRATE

[75] Inventors: Peter O. Butler, Hillsboro; Ricardo E. Suarez-Gartner, Beaverton, both of Oreg.

[73] Assignee: Intel Corporation, Santa Clara, Calif.

[21] Appl. No.: 625,794

[22] Filed: Mar. 29, 1996

[51] Int. Cl.[6] .................................................. H05K 1/18
[52] U.S. Cl. ..................... 361/773; 361/758; 361/756; 361/760; 361/770; 361/807; 361/809; 361/765; 228/123.1; 257/684; 257/686; 257/780; 174/52.4; 174/52.1; 174/250; 174/255; 437/203; 437/209; 437/180

[58] Field of Search .................... 361/773, 758, 361/774, 756, 760, 770, 771, 777, 779, 807, 809, 765, 783, 808, 790, 785, 791; 228/123.1; 257/684, 685, 686, 786, 692, 697, 727, 640, 780, 778, 782; 174/52.4, 52.1, 250, 254, 255; 437/209, 203, 180, 187, 189

[56] References Cited

U.S. PATENT DOCUMENTS

| | | | |
|---|---|---|---|
| 4,390,220 | 6/1983 | Benasutti | 339/17 |
| 4,504,887 | 3/1985 | Bakermans et al. | 361/399 |
| 5,413,489 | 5/1995 | Switky | 439/71 |
| 5,515,241 | 5/1996 | Werther | 361/784 |

*Primary Examiner*—Leo P. Picard
*Assistant Examiner*—David Foster
*Attorney, Agent, or Firm*—Blakely, Sokoloff, Taylor & Zafman

[57] ABSTRACT

A method and apparatus for reducing warpage of an assembly substrate and providing registration between a surface mount technology (SMT) component and the assembly substrate. The SMT component includes mounting pins extending from the component and capable of engaging corresponding apertures in the assembly substrate. Each mounting pin is registrable with a corresponding aperture in the assembly substrate. The mounting pins are capable of providing an interference fit between the SMT component and the assembly substrate.

18 Claims, 4 Drawing Sheets

METHOD AND APPARATUS FOR REDUCING WARPAGE OF AN ASSEMBLY SUBSTRATE

BACKGROUND OF THE INVENTION

1. Field of the Invention

The present invention relates to a system for mounting a component on an assembly substrate. More specifically, a system for reducing warpage of an assembly substrate with respect to a surface mount technology (SMT) component and providing registration between the SMT component and the substrate.

2. Background

Surface mount technology utilizes leadless components which are soldered to a land array on the surface of an assembly substrate. Surface mount technology does not require the use of through holes to receive component leads. SMT components may include array connectors, sockets, and integrated circuit packages. The assembly substrate may be a printed circuit board (PCB) manufactured from laminated epoxy glass, epoxy, silicon, or other material.

SMT is noted for its ability to provide dense packages, thereby minimizing component size as well as substrate size. To achieve this density, SMT components and land arrays include relatively small electrical contact surfaces. Thus, tolerances in SMT devices and assembly substrates are critical to ensure proper electrical connection between the substrate and the component.

Problems arise when assembly substrates warp such that their surface is not coplanar. Substrate warpage is not generally a problem for through-hole substrates and components because of the reduced density and increased spacing between the electrical contacts. Furthermore, through-hole components have long leads, typically on the order of 60 to 120 mils, or longer. A typical warpage specification for an assembly substrate is 10 mils of warpage per inch. Therefore, a component having a dimension of 2.5 inches may experience up to 25 mils of warpage by the assembly substrate. With a through-hole component, the lead length of 60 to 120 mils easily compensates for the substrate warpage. Thus, substrate warpage is not generally a problem for through-hole mounted components.

However, the tolerances required when using SMT components are more stringent than those of the through-hole mounted components. As part of the SMT assembly process, solder paste is screened onto the assembly substrate. Typically, the solder paste thickness is approximately 6 mils. Electrical terminations on the SMT component must be sufficiently close to the solder paste or electrical contacts on the assembly substrate to produce a proper solder joint. If an SMT component has a dimension of 2.5 inches, substrate warpage may produce a 25 mil gap between the middle of the component and the substrate surface. In this situation, several of the component terminations will not contact the solder paste on the substrate. If the electrical terminations of the SMT component do not contact the solder paste, the necessary solder joints will not be established during the manufacturing process.

In addition to substrate warpage problems, registration problems occur when attempting to properly align an SMT component with the land pattern on the assembly substrate. Due to the small tolerances and small size of the electrical contact surfaces, a slight misalignment of the component with respect to the substrate may result in short circuits between adjacent contact surfaces, missing connections or improper connections, causing incorrect operation of the circuit.

Previous attempts to solve substrate warpage problems have utilized a specialized substrate carrier to flatten the substrate as it is moved through the manufacturing process. This substrate carrier adds an additional level of complexity to the manufacturing process since the carrier must be attached to the assembly substrate throughout the manufacturing process. This additional carrier adds to the overall cost and complexity of the manufacturing process. Furthermore, the substrate carrier does not provide any type of registration for aligning the SMT component on the assembly substrate.

SUMMARY OF THE INVENTION

The present invention provides a method and apparatus for reducing warpage of an assembly substrate. The invention further provides for registration between a surface mount technology (SMT) component and the assembly substrate. By reducing substrate warpage, the present invention provides a more uniform distance between the SMT component and the assembly substrate, thereby producing higher quality solder joints. The present invention does not require the use of substrate carriers to flatten the substrate during the manufacturing process. Proper registration of the SMT component with respect to the assembly substrate prevents improper electrical connections between the component and the substrate.

One embodiment of the present invention provides an assembly substrate having several apertures. Corresponding mounting pins extend from the SMT component and are arranged to be registrable with the apertures in the assembly substrate. The mounting pins are capable of engaging the corresponding apertures to provide an interference fit between the SMT component and the assembly substrate. This interference fit reduces warpage of the assembly substrate to provide increased solder joint quality.

Other features of the present invention provide a snap-fit connection or a press-fit connection between the SMT component and the assembly substrate. The snap-fit or press-fit connection provides a secure connection between the SMT component and the assembly substrate.

Another feature of the present invention provides a mounting pin having an annular shoulder to maintain a substantially uniform separation between the SMT component and the assembly substrate.

One aspect of the present invention involves aligning the mounting pins extending from the SMT component with the apertures in the assembly substrate and inserting the mounting pins into the apertures. The SMT component is then urged toward the assembly substrate to reduce warpage of the substrate and generate an interference fit between the SMT component and the substrate.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

The following detailed description sets forth numerous specific details to provide a thorough understanding of the present invention. However, those skilled in the art will appreciate that the present invention may be practiced without these specific details. In other instances, well known methods, procedures, components, and circuits have not been described in detail so as not to obscure the present invention.

The present invention is related to a system for reducing the warpage of an assembly substrate and providing registration between a surface mount technology (SMT) component and the assembly substrate. The reduction in substrate warpage provides a more uniform separation between the SMT component and the assembly substrate, thereby producing higher quality solder joints between the component and the substrate. Additionally, registration between the component and the substrate ensures a proper connection between the substrate land pattern and the component terminations.

Figure 1:
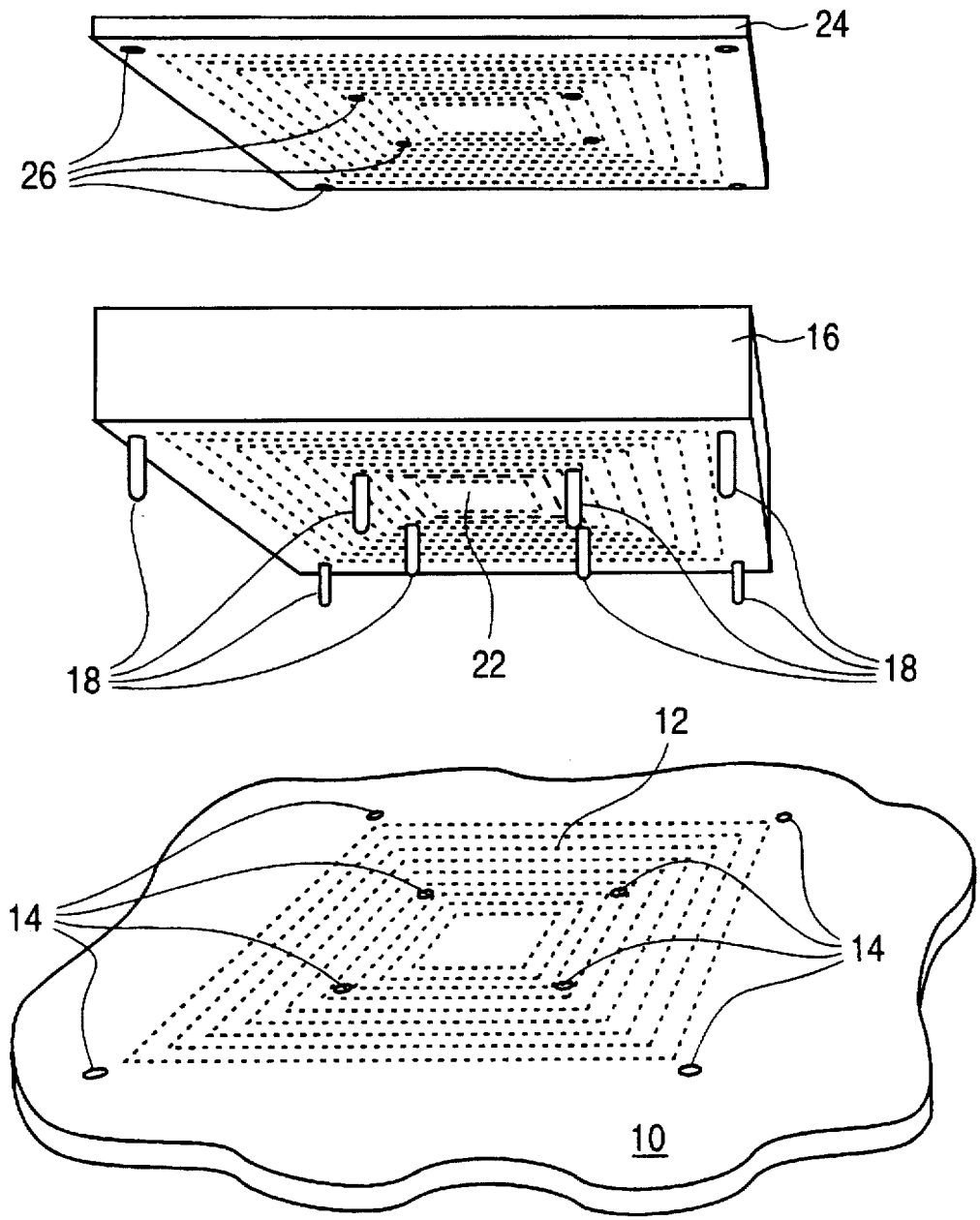
FIG. 1 is an exploded perspective view of an assembly substrate, socket, and SMT component according to the present invention.

Referring to FIG. 1, an assembly substrate 10 is illustrated having a land pattern 12 including a plurality of contact surfaces. Land pattern 12 may include screened or stenciled solder/flux for use in creating solder joints with an SMT component during the manufacturing process.

Assembly substrate 10 also includes a plurality of apertures 14 extending through the substrate. As an example, eight apertures 14 are illustrated in FIG. 1. However, those skilled in the art will appreciate that any number of apertures may be used depending on the requirements of the substrate and the component.

An SMT component 16 is illustrated as a socket, and includes eight mounting pins 18 extending from one surface of the component. SMT component 16 also includes an array of component terminations 22 for connection with assembly substrate land pattern 12. Mounting pins 18 align with apertures 14 in substrate 10. A second SMT component 24, represents an integrated circuit, including terminations 26 for making electrical contact with corresponding terminals in component 16.

FIG. 1 illustrates two types of SMT components: a socket 16 and an integrated circuit 24. However, the present invention may be used with any type of SMT component, as well as integrated circuit die-level components. The assembly substrate may be laminated epoxy glass, epoxy, silicon, or any other substrate material.

Figure 2:
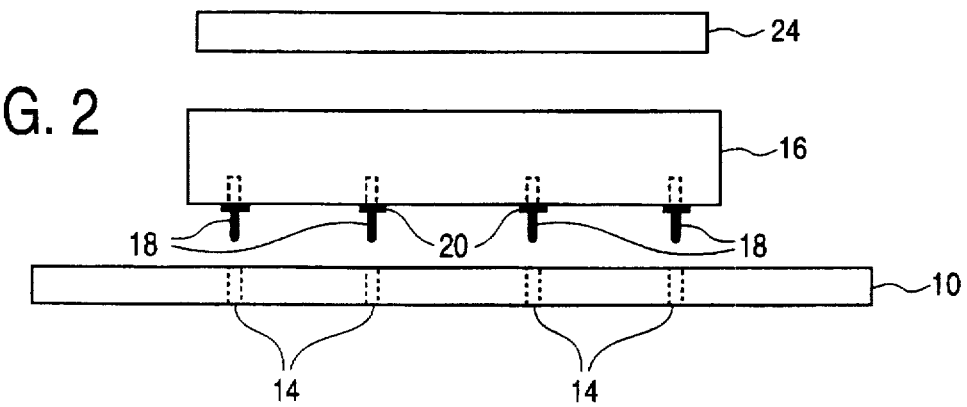
FIG. 2 is a side view of the elements shown in FIG. 1.

Referring to FIG. 2, a side view of the components illustrated in FIG. 1 is provided. The alignment of mounting pins 18 with apertures 14 is illustrated. For explanation purposes, assembly substrate 10 in FIG. 2 is substantially coplanar; i.e., does not exhibit any significant warpage. Each mounting pin 18 is illustrated with an annular shoulder 20 extending around the mounting pin. Annular shoulder 20 maintains a substantially uniform spacing between component 16 and substrate 10. FIGS. 3A-3D illustrate annular shoulder 20 in greater detail.

Annular shoulder 20 is an optional addition to mounting pin 18 and is not required for proper operation of the invention. Providing spacing between component 16 and substrate 10 is useful for reflow work where hot air is blown under the component to reflow the solder and permit removal of the component from the substrate. A mounting pin without a shoulder may be used with the present invention, but will not provide the additional separation created by the shoulder.

As shown by phantom lines in FIG. 2, each mounting pin 18 extends into component 16. In the preferred embodiment, mounting pins 18 are molded into component 16 at the time of component manufacture. Alternatively, mounting pins 18 may be press-fit or snap-fit into a cavity in the component at a later time. The length of mounting pins 18 may vary; i.e., the mounting pins may extend partially into aperture 14, or extend through aperture 14 and beyond the opposite side of the substrate. The necessary length of mounting pin 18 depends on the particular application, as will be described in greater detail below.

In another embodiment of the present invention, the location of mounting pins 18 and apertures 14 are reversed; i.e., mounting pins 18 are securely mounted to assembly substrate 10, and component 16 includes a series of apertures to receive the mounting pins. The mounting pins and apertures are similar to those discussed above and operate in a similar manner.

Although FIG. 2 illustrates mounting pins extending from a socket component, the mounting pins may extend directly from an integrated circuit component, thereby eliminating the need for an intermediate socket.

Figure 3A:
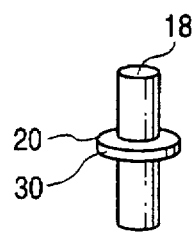
FIGS. 3A–3D are perspective views of various pins adapted for use with the present invention.
Figure 3B:
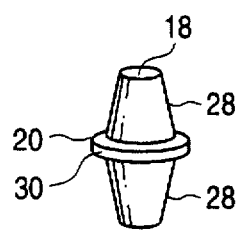

FIGS. 3A-3D illustrate various types of mounting pins capable of being used with the present invention. FIG. 3A illustrates a simple cylindrical mounting pin having a shoulder 20 including a thickness 30. Shoulder thickness 30 determines the separation established between the component and the substrate. FIG. 3B illustrates a mounting pin 18 tapered at each end. Tapered sides 28 permit the mounting pin to be press-fit into either assembly substrate 10 or SMT component 16. Alternatively, the mounting pin of FIG. 3B may be press-fit into both the assembly substrate and the SMT component.

Figure 3C:
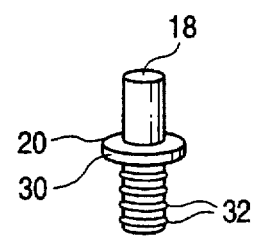

FIG. 3C illustrates a mounting pin 18 having a series of annular rings 32 extending around a portion of the mounting pin. Annular rings 32 are provided to engage a self-capturing fastener attached to the mounting pin, as described in greater detail below. Alternatively, annular rings 32 may be used to provide press-fit mounting in the substrate aperture without the use of a fastener.

Figure 3D:
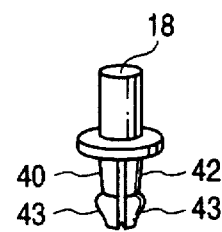

FIG. 3D illustrates a mounting pin 18 having one end split into two resilient arms 40 and 42. Each resilient arm includes a projection 43 extending from the distal end of the arm. The mounting pin illustrated in FIG. 3D may be referred to as a self-locking split pin. Resilient arms 40 and 42 deflect toward one another when forced through an aperture in the substrate, but return to their original position after projections 43 pass through the aperture, thereby securing the pin to the substrate. The gap between resilient arms 40 and 42 allows the arms to deflect toward one another.

Those skilled in the art will appreciate that other types of mounting pins may be used with the present invention.

FIGS. 3A–3D are merely examples of suitable mounting pins, and do not represent all possible mounting pins. Another suitable mounting pin is a plastic heat-staked rivet (not shown) which initially resembles a straight pin, but is formed into a rivet during installation by using heat to deform an end of the pin.

Figure 4:
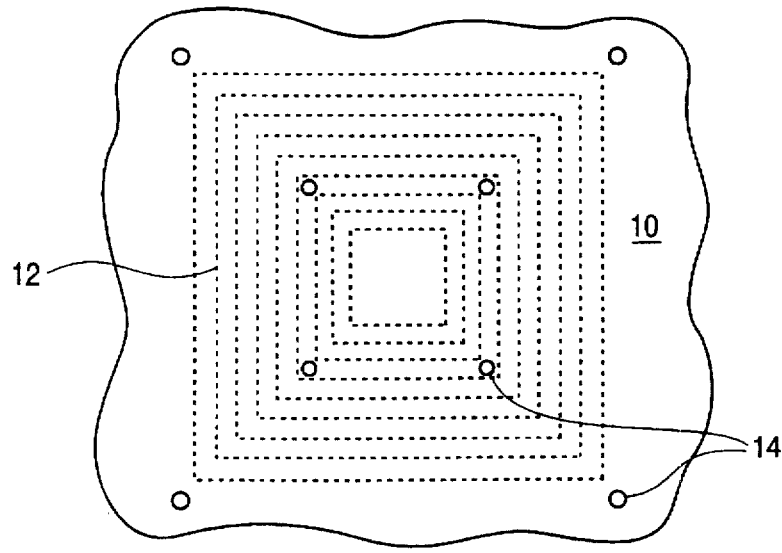
FIG. 4 is a top view of the assembly substrate illustrating the land pattern and apertures.

Referring to FIG. 4, a top view of assembly substrate 10 is illustrated. FIG. 4 shows an example of the arrangement of land pattern 12 and apertures 14 on substrate 10.

Figure 5:
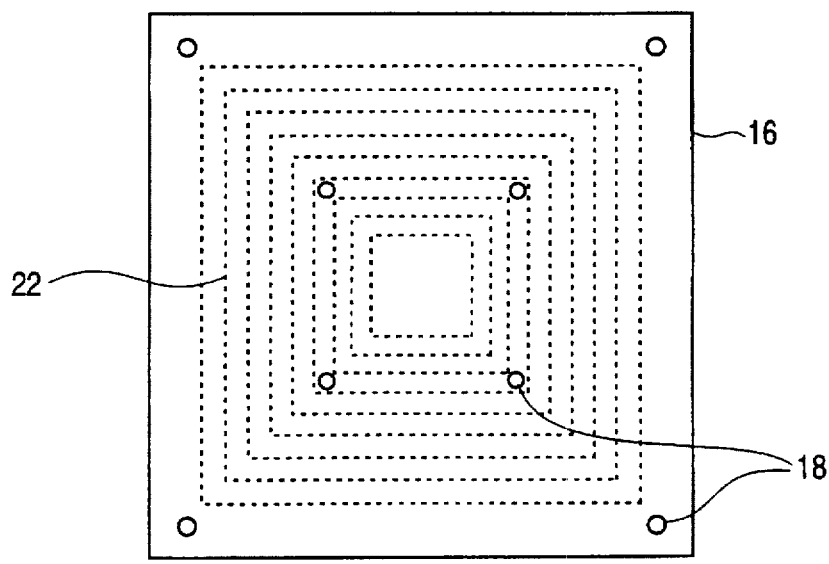
FIG. 5 is a bottom view of the SMT component of FIG. 1.

Referring to FIG. 5, a bottom view of SMT component 16 is illustrated. Mounting pins 18 are positioned to align with apertures 14 in the assembly substrate, as illustrated in FIG. 4. Additionally, the pattern and arrangement of component terminations 22 corresponds with land pattern 12 on assembly substrate 10. Component terminations 22 may include solder tails, solder balls, or any other component termination mechanism. To create proper solder joints during the manufacturing process, component terminations 22 must contact land pattern 12.

FIGS. 4 and 5 illustrate a specific pattern for apertures 14 and mounting pins 18. Those skilled in the art will appreciate that various land patterns and aperture placements may be used (either symmetrical or asymmetrical) to practice the present invention.

Figure 6:
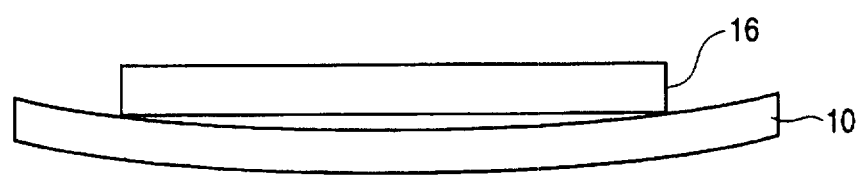
FIG. 6 is a side view illustrating a warped assembly substrate.

FIG. 6 illustrates a warped assembly substrate with an SMT component positioned on the substrate. The actual warpage of assembly substrate 10 is exaggerated in FIG. 6 to illustrate the problems caused by a non-coplanar substrate. As shown in FIG. 6, a significant gap is created between substrate 10 and component 16 as a result of the warpage. As discussed above, a gap between component terminations 22 and land pattern 12 prevents the creation of proper solder joints between component 16 and substrate 10.

Figure 7:
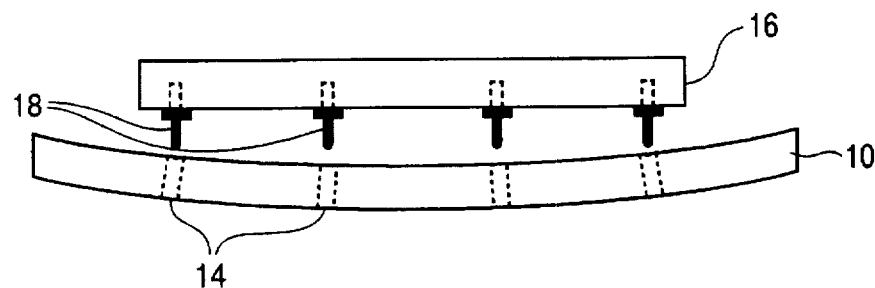
FIGS. 7-9 illustrate mounting the SMT component to the assembly substrate.
Figure 8:
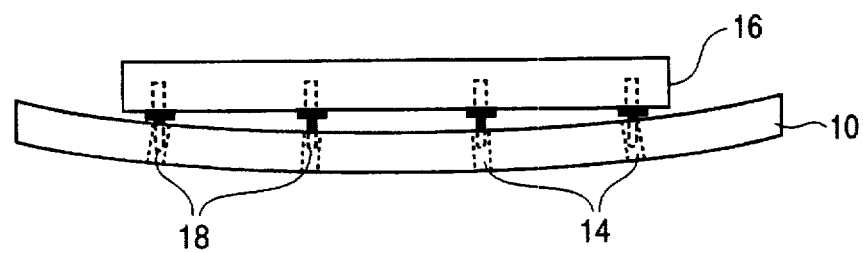
Figure 9:
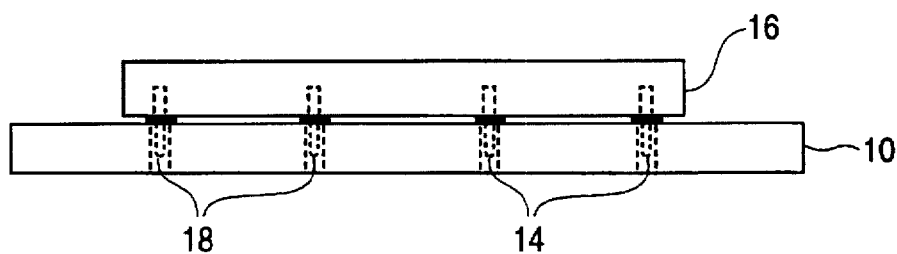

FIGS. 7–9 illustrate the procedure used to attach SMT component 16 to assembly substrate 10 according to the present invention. FIG. 7 illustrates component 16 prior to attachment to assembly substrate 10. As shown, assembly substrate 10 is warped while component 16 is substantially coplanar.

FIG. 8 illustrates component 16 at an intermediate mounting stage. At this point, the edges of component 16 have contacted assembly substrate 10, but a gap exists between the middle of the component and the assembly substrate. FIG. 8 also illustrates that mounting pins 18 are partially inserted into apertures 14.

FIG. 9 illustrates a fully mounted component 16 on assembly substrate 10. As illustrated in FIG. 9, the warpage of assembly substrate 10 has been reduced, and the separation between component 16 and substrate 10 is substantially uniform. This uniformity results in an improved contact between component terminations 22 and land pattern 12 as the substrate moves through the manufacturing process. The reduction in warpage of substrate 10 is provided by the interaction between mounting pins 18 and apertures 14. Various types of mounting pins are illustrated in FIGS. 3A–3D and provide for press-fitting, snap-fitting, and the use of self-capturing fasteners.

As illustrated in FIG. 9, mounting pins 18 extend partially through apertures 14. Alternatively, mounting pins 18 may have a greater length such that they extend through apertures 14 and beyond the opposite side of assembly substrate 10.

Figure 10:
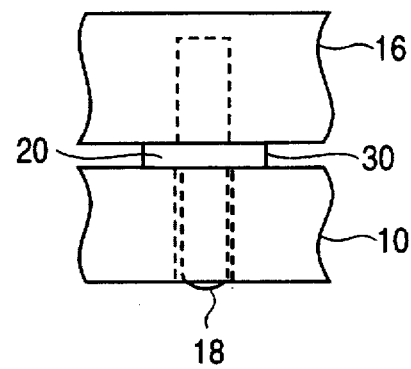
FIG. 10 is a detailed view of a single mounting pin.

Referring to FIG. 10, a detailed diagram illustrates the interaction between a single mounting pin 18, SMT component 16, and assembly substrate 10. As illustrated, component 16 and substrate 10 are separated by shoulder 20, having a thickness 30.

Figure 11A:
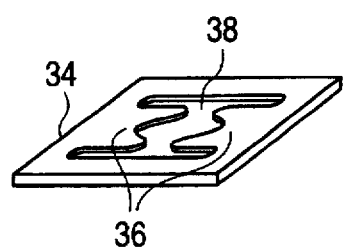
FIGS. 11A and 11B illustrate two types of self-capturing fasteners.
Figure 11B:
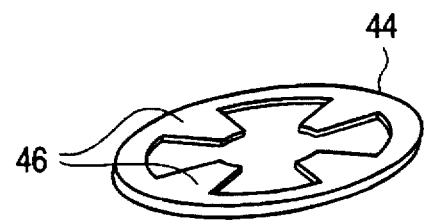

FIGS. 11A and 11B illustrate two types of self-capturing fasteners. The self-capturing fastener shown in FIG. 11A is commonly referred to as a Tinnerman nut. Tinnerman nut 34 includes a pair of resilient tabs 36 located on opposite sides of an opening 38. Opening 38 is provided to receive a mounting pin, screw, or similar device. FIG. 11B illustrates another fastener 44 having an annular shape and a plurality of resilient tabs 46 extending inwardly. Resilient tabs 46 act to secure fastener 44 to a mounting pin. Both self-capturing fasteners 34 and 44 may be used with various types of mounting pins, including the mounting pins illustrated in FIGS. 3A–3C. When using any type of self-capturing fastener, mounting pin 18 must extend beyond the opposite side of assembly substrate 10 to provide an area for attaching and securing the fastener to the mounting pin.

Figure 12:
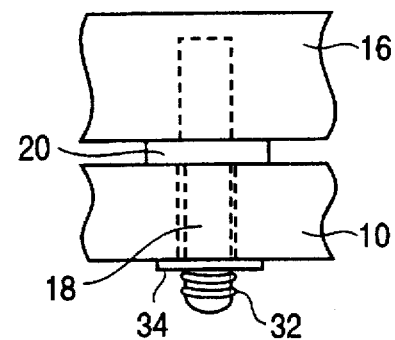
FIG. 12 is a detailed view of a mounting pin utilizing a self-capturing fastener.

FIG. 12 illustrates a specific use of a Tinnerman nut 34 in conjunction with a mounting pin 18 of the type illustrated in FIG. 3C. The mounting pin 18 includes a series of annular rings 32. Mounting pin 18 extends through and beyond assembly substrate 10, to provide an area for attachment of Tinnerman nut 34. Mounting pin 18 extends through opening 38 in nut 34, and resilient tabs 36 engage rings 32, thereby securing mounting pin 18 to assembly substrate 10. In this configuration, a Tinnerman nut 34 is provided for each mounting pin 18 extending from component 16. Alternatively, self-capturing fastener 44 (shown in FIG. 11B) may be used in place of Tinnerman nut 34 in FIG. 12.

In operation, mounting pins 18 provide a system for registering component 16 with assembly substrate 10. This registration system ensures proper alignment and proper electrical connection between component 16 and substrate 10. Additionally, mounting pins 18 and apertures 14 reduce the warpage of assembly substrate 10. As described above with respect to FIGS. 7–9, mounting pins 18 are aligned with apertures 14 in assembly substrate 10. Component 16 is then urged or pressed against assembly substrate 10, forcing mounting pins 18 into engagement with apertures 14. The engagement between mounting pins 18 and apertures 14 provides an interference fit, thereby preventing release of the mounting pins from the apertures and preventing the assembly substrate from returning to its warped position.

As component 16 is urged toward substrate 10, the substrate is flattened, thereby reducing warpage. The present invention ensures that warpage of substrate 10 is reduced to a certain level because mounting pins 18 cannot fully engage apertures 14 until the substrate is substantially coplanar. After component 16 has been securely mounted to substrate 10, the component will hold the substrate in the substantially coplanar position. Thus, the final manufacturing processes may be performed without requiring any specialized carrier or device for flattening the assembly substrate. "Substantially coplanar", as used in this specification, does not require that all warpage is removed from substrate 10. Rather, substantially coplanar requires that the substrate warpage is reduced to a level at which the maximum gap between land pattern 12 and component terminations 22 is within acceptable manufacturing tolerances to provide a proper solder joint between the land pattern and the terminations.

In another embodiment of the present invention, mounting pins 18 may have a diameter smaller than the diameter of the apertures 14, such that an interference fit is not created. In this situation, the mounting pins and apertures are used for alignment purposes only, and do not function to reduce warpage of the assembly substrate. In this embodiment, fewer mounting pins and apertures may be used, since the only function being performed is registration of the SMT component with the assembly substrate. Additionally, it may be desirable to provide an asymmetrical pattern of apertures and mounting pins to ensure proper registration and orientation of the component with the substrate.

The embodiments described above may be used with SMT components having either stiff leads or compliant (flexible) leads. Additionally, the above embodiments may be used with die-level components to reduce warpage and provide registration between the die-level components.

From the above description and drawings, it will be understood by those skilled in the art that the particular embodiments shown and described are for purposes of illustration only and are not intended to limit the scope of the invention. Those skilled in the art will recognize that the invention may be embodied in other specific forms without departing from its spirit or essential characteristics. References to details of particular embodiments are not intended to limit the scope of the claims.

What is claimed is:

1. An apparatus for reducing warpage of an assembly substrate with respect to a surface mount technology (SMT) component, said assembly substrate including a plurality of apertures therethrough, said apparatus comprising:

a plurality of mounting pins extending from said SMT component, said mounting pins corresponding to and registrable with said apertures in said assembly substrate, said mounting pins adapted to provide an interference fit between said SMT component and said assembly substrate.

2. The apparatus of claim 1 wherein each mounting pin provides a snap-fit connection between said SMT component and said assembly substrate.

3. The apparatus of claim 1 wherein each mounting pin is tapered to provide a press-fit connection between said SMT component and said assembly substrate.

4. The apparatus of claim 1 further including a plurality of self-capturing fasteners adapted to be secured to said plurality of mounting pins to secure said SMT component to said assembly substrate.

5. The apparatus of claim 1 wherein each mounting pin includes an annular shoulder to maintain a substantially uniform separation distance between said SMT component and said assembly substrate.

6. An apparatus for reducing warpage of an assembly substrate with respect to a surface mount technology (SMT) component, said SMT component including a plurality of apertures therein, said apparatus comprising:

a plurality of mounting pins extending from said assembly substrate, said mounting pins corresponding to and registrable with said apertures in said SMT component, said mounting pins adapted to provide an interference fit between said assembly substrate and said SMT component.

7. The apparatus of claim 6 wherein each mounting pin provides a snap-fit connection between said assembly substrate and said SMT component.

8. The apparatus of claim 6 wherein each mounting pin is tapered to provide a press-fit connection between said assembly substrate and said SMT component.

9. The apparatus of claim 6 further including a plurality of self-capturing fasteners adapted to be secured to said plurality of mounting pins to secure said assembly substrate to said SMT component.

10. The apparatus of claim 6 wherein each mounting pin includes an annular shoulder to maintain a substantially uniform separation distance between said assembly substrate and said SMT component.

11. An apparatus for providing registration between an assembly substrate and a surface mount technology (SMT) component, said assembly substrate including a plurality of apertures therethrough, said apparatus comprising:

a plurality of mounting pins extending from said SMT component, said mounting pins corresponding to and registrable with said apertures in said assembly substrate, said mounting pins adapted to engage said apertures in said assembly substrate to register said SMT component with said assembly substrate wherein the interaction between said mounting pins and said apertures in said assembly substrate securely joins said SMT component to said assembly substrate.

12. The apparatus of claim 11 wherein each mounting pin includes an annular shoulder to maintain a substantially uniform separation distance between said SMT component and said assembly substrate.

13. The apparatus of claim 11 wherein each mounting pin includes a first diameter and each aperture in said assembly substrate includes a second diameter, said first diameter being less than said second diameter.

14. A method for reducing warpage of an assembly substrate with respect to a surface mount technology (SMT) component, wherein said assembly substrate includes a plurality of apertures therethrough and said SMT component includes a plurality of mounting pins extending therefrom, said method comprising the steps of:

aligning said plurality of mounting pins with said plurality of apertures in said assembly substrate;

inserting said plurality of mounting pins into said plurality of apertures in said assembly substrate; and urging said SMT component toward said assembly substrate to generate an interference fit between said SMT component and said assembly substrate.

15. The method of claim 14 further including the step of maintaining a substantially uniform separation distance between said SMT component and said assembly substrate.

16. The apparatus of claim 1 wherein said SMT component is in electrical contact with said assembly substrate when said interference fit is established.

17. The apparatus of claim 6 wherein said SMT component is in electrical contact with said assembly substrate when said interference fit is established.

18. The apparatus of claim 11 wherein said SMT component is in electrical contact with said assembly substrate when said interference fit is established.

* * * * *